United States Patent
Tokuda et al.

(10) Patent No.: US 8,563,940 B2
(45) Date of Patent: Oct. 22, 2013

(54) RADIATION DETECTOR MANUFACTURING METHOD, A RADIATION DETECTOR, AND A RADIOGRAPHIC APPARATUS

(75) Inventors: Satoshi Tokuda, Kusatsu (JP); Tamotsu Okamoto, Kisarazu (JP); Hiroyuki Kishihara, Kizugawa (JP); Masatomo Kaino, Kyoto-fu (JP); Toshinori Yoshimuta, Takatsuki (JP); Koichi Tanabe, Uji (JP)

(73) Assignees: Shimadzu Corporation, Kyoto (JP); Institute of National Colleges of Technology, Japan, Tokyo (JP)

( * ) Notice: Subject to any disclaimer, the term of this patent is extended or adjusted under 35 U.S.C. 154(b) by 204 days.

(21) Appl. No.: 13/262,098

(22) PCT Filed: Apr. 3, 2009

(86) PCT No.: PCT/JP2009/001570
§ 371 (c)(1),
(2), (4) Date: Sep. 29, 2011

(87) PCT Pub. No.: WO2010/113222
PCT Pub. Date: Oct. 7, 2010

(65) Prior Publication Data
US 2012/0093290 A1 Apr. 19, 2012

(51) Int. Cl.
*H01L 27/146* (2006.01)
(52) U.S. Cl.
USPC ............................ 250/370.09; 250/370.13
(58) Field of Classification Search
USPC ........................... 250/370.09, 370.13
See application file for complete search history.

(56) References Cited

U.S. PATENT DOCUMENTS

| 6,512,233 | B1 | 1/2003 | Sato et al. |
| 7,211,142 | B2 | 5/2007 | Hirano |
| 2009/0050813 | A1 | 2/2009 | Sato et al. |

FOREIGN PATENT DOCUMENTS

| JP | 2001-242255 A | 9/2001 |
| JP | 2003-277197 A | 10/2003 |
| KR | 10-2008-0094804 A | 10/2008 |

OTHER PUBLICATIONS

Matveev et al. "Conductivity compensation in CdZnTe:Cl crystals with variable zinc content," Technical Physics Letters, 2007, vol. 33. No. 4, pp. 358-360.*
Park et al. "The effect of Cl-Doping concentration on the resistivity of polycrystalline CdZnTe:Cl thick film," Nuclear Science Symposium Conference Record, 2004 IEEE, vol. 7, pp. 4425-4427.*

(Continued)

*Primary Examiner* — Constantine Hannaher
*Assistant Examiner* — Mindy Vu
(74) *Attorney, Agent, or Firm* — Cheng Law Group, PLLC

(57) ABSTRACT

According to a radiation detector manufacturing method, a radiation detector and a radiographic apparatus of this invention, Cl-doped CdZnTe is employed for a conversion layer, with Cl concentration set to 1 ppm wt to 3 ppm wt inclusive, and Zn concentration set to 1 mol % to 5 mol % inclusive. This can form the conversion layer optimal for the radiation detector. Consequently, the radiation detector manufacturing method, the radiation detector and the radiographic apparatus can be provided which can protect the defect level of crystal grain boundaries by Cl doping in a proper concentration, and can further maintain integral sensitivity to radiation, while reducing leakage current, by Zn doping in a proper concentration.

10 Claims, 8 Drawing Sheets

(56) References Cited

OTHER PUBLICATIONS

Ayoub et al. "Annealing effects on defect levels of CdTe:Cl materials and the uniformity of the electrical properties," IEEE transactions on nuclear science, vol. 50, No. 2, pp. 229-237, Apr. 2003.*

Korean Office Action for the Application No. 10-2011-7024279 dated Jan. 7, 2013.
Lee, B. J., et al., "A Study on Development of a PIN Semiconductor Detector for Measuring Individual Dose", J. Korea Asso. Radiat. Prot., 2003, vol. 28, No. 2, pp. 87-95.

* cited by examiner

RADIATION DETECTOR MANUFACTURING METHOD, A RADIATION DETECTOR, AND A RADIOGRAPHIC APPARATUS

TECHNICAL FIELD

This invention relates to detection of radiation used in the medical field and the industrial field such as nondestructive testing, RI (Radio Isotope) examination and optical examination, and more particularly relates to a radiation detector manufacturing method, a radiation detector and a radiographic apparatus using a conversion layer for converting radiation into electric charge signals.

BACKGROUND ART

Conventionally, various semiconductor materials are studied as materials for a radiation conversion layer of a highly sensitive radiation detector. Research and development have been made on single crystal bodies of CdTe (cadmium telluride) or CdZnTe (zinc telluride cadmium), and some products have been commercialized. When radiation is incident on these single crystal bodies, carriers (electron-hole pairs) corresponding to the dose of radiation will be generated, and the radiation is detected by taking out charge signals resulting from these carriers. However, for application to a radiation detector for medical diagnosis, it is necessary to form a radiation conversion layer of large area (e.g. 20 cm square or larger). To form a single crystal body of such a large area is technically difficult and requires huge cost. Then, a radiation conversion layer consisting of a crystal growth as a polycrystal compound semiconductor layer instead of the single crystal body is considered promising.

With a small radiation detector using CdTe single crystal, it is known that doping CdTe single crystal with Zn (zinc) reduces leakage current flowing through CdTe single crystal. Doping CdTe single crystal with a halogen such as Cl (chlorine) is known to improve carrier mobility in CdTe single crystal. For example, an optimal Cl concentration for improving detection performance of CdTe single crystal is disclosed in Patent Document 1.

As for factors obstructive to the carrier mobility in the single crystal body of CdTe, a charge trap due to crystal defects or impurities is considered to be a main factor. However, with the polycrystal compound semiconductor layer, it is thought that the action of crystal grain boundaries and grain size distribution is added, and the optimal Cl concentration is not necessarily the same as in the case of the single crystal body.

An optimal Zn concentration for doping the CdTe polycrystal compound semiconductor layer, although disclosed in Patent Document 2, for example, has a wide range of several to several tens of mol %. Although its doping has an effect such as of reducing leakage current, its extent has been unknown. Optimal Zn concentration and Cl concentration when doping with Zn and Cl have been unknown. Thus, the optimal concentrations of Zn and Cl for doping the polycrystal compound semiconductor layer of CdTe have been unknown.

Patent Document 1

Unexamined Patent Publication No. 2003-277197

Patent Document 2

Unexamined Patent Publication No. 2001-242255

DISCLOSURE OF THE INVENTION

Problem to be Solved by the Invention

This invention has been made having regard to the state of the art noted above, and its object is to provide a radiation detector manufacturing method, a radiation detector and a radiographic apparatus, having excellent carrier mobility and high sensitivity and response to radiation due to a Cl-doped CdZnTe polycrystal compound semiconductor layer with optimal Zn concentration and Cl concentration.

Means for Solving the Problem

To fulfill the above object, this invention provides the following construction.

A radiation detector of this invention is a radiation detector having a conversion layer for converting radiation into charge signals, wherein the conversion layer comprises a Cl-doped CdZnTe polycrystal compound semiconductor layer having a Zn concentration from 1 mol % to 5 mol % inclusive and a Cl concentration from 1 ppm wt to 3 ppm wt inclusive.

According to the radiation detector of this invention, the conversion layer for converting radiation into charge signals comprises a Cl-doped CdZnTe polycrystal compound semiconductor layer, which has a Zn concentration from 1 mol % to 5 mol % inclusive and further a Cl concentration from 1 ppm wt to 3 ppm wt inclusive. Consequently, the defect level of crystal grain boundaries can be protected effectively by forming the Cl-doped CdZnTe polycrystal compound semiconductor layer with a proper Cl concentration. Further, by Zn doping in a proper concentration, the sensitivity to radiation can be improved while increasing the resistivity of the semiconductor and reducing leakage current. These enable acquisition of a radiation detector excellent in sensitivity and response to radiation, noise and S/N.

Further, when the Zn concentration in the Cl-doped CdZnTe polycrystal compound semiconductor layer is from 1 mol % to 2 mol % inclusive, the sensitivity to radiation can be further improved while maintaining leakage current in a required range. Since a carrier injection blocking layer is formed on one surface or both surfaces of the conversion layer for preventing injection of electrons or holes, the radiation detector obtained has a good mobility of converted charge signals, further reduces leakage current, and has excellent response to radiation. As this carrier injection blocking layer, an n-type or p-type semiconductor layer can be employed.

An active matrix substrate may be provided for reading the charge signals for respective detecting elements in a two-dimensional matrix arrangement formed by dividing the conversion layer. Since the charge signals can be read for the respective detecting elements, the radiation detector obtained has high resolution and low leakage current. Further, with an opposite substrate with the conversion layer laminated thereon and the active matrix substrate being connected by connection electrodes, the conversion layer can be formed separately in a temperature situation exceeding the heatproof temperature of the active matrix substrate.

A radiographic apparatus of this invention is a radiographic apparatus comprising a radiation emitting device for emitting radiation to a subject; a radiation detector for converting, in a conversion layer, radiation transmitted through the subject into charge signals, and outputting the charge signals as electric signals; and an image processor for constructing a radiation transmission image of the subject based on the electric signals; wherein the conversion layer comprises a Cl-doped CdZnTe polycrystal compound semiconductor layer having a Zn concentration from 1 mol % to 5 mol % inclusive and a Cl concentration from 1 ppm wt to 3 ppm wt inclusive.

According to the radiographic apparatus of this invention, the conversion layer for converting radiation transmitted through the subject into charge signals comprises a Cl-doped CdZnTe polycrystal compound semiconductor layer, which has a Zn concentration from 1 mol % to 5 mol % inclusive and further a Cl concentration from 1 ppm wt to 3 ppm wt inclusive. Consequently, the radiographic apparatus provided is excellent in sensitivity and response to radiation, noise and S/N A method of manufacturing of a radiation detector of this invention is a method of manufacturing of a radiation detector having a conversion layer for converting radiation into charge signals, wherein the conversion layer comprises a Cl-doped CdZnTe polycrystal compound semiconductor layer formed by a proximity sublimation method and having a Zn concentration from 1 mol % to 5 mol % inclusive and a Cl concentration from 1 ppm wt to 3 ppm wt inclusive.

According to the method of manufacturing of a radiation detector of this invention, the Cl-doped CdZnTe polycrystal compound semiconductor layer is formed to have the Zn concentration from 1 mol % to 5 mol % inclusive, and the Cl dope concentration from 1 ppm wt to 3 ppm wt inclusive. Since the proximity sublimation method is used for this formation, the growth speed of polycrystal is increased to form it efficiently. The polycrystal compound semiconductor layer with good uniformity can be formed at low cost. The defect level of crystal grain boundaries can be effectively protected by Cl in a proper concentration. Further, by Zn doping in a proper concentration, the resistivity of the semiconductor can be increased and leakage current reduced. These enable acquisition of a radiation detector excellent in sensitivity and response to radiation, noise and S/N.

Effects of the Invention

According to the radiation detector manufacturing method, the radiation detector and the radiographic apparatus of this invention, the radiation detector manufacturing method, the radiation detector and the radiographic apparatus can be provided to have good carrier mobility and high sensitivity and response to radiation, which is achieved by means of a Cl-doped CdZnTe polycrystal compound semiconductor layer with optimal Zn concentration and Cl concentration.

DESCRIPTION OF REFERENCES

Figure 1:
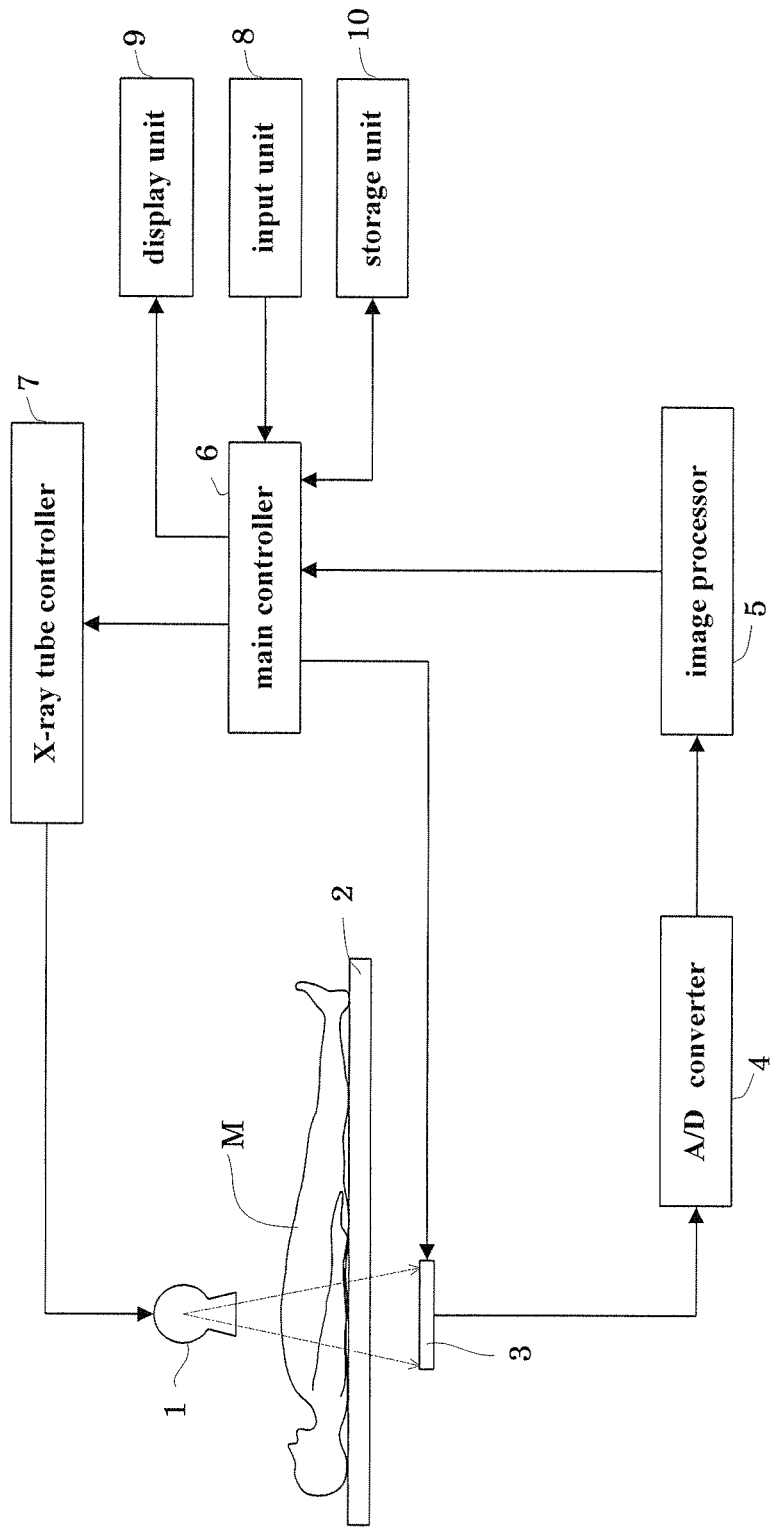
FIG. 1 is a block diagram showing an overall construction of an X-ray imaging apparatus according to an embodiment.

3 . . . X-ray flat panel detector
11 . . . conversion layer
14 . . . thin-film transistors
25 . . . active matrix substrate
26 . . . bump electrodes
28 . . . pixel electrodes
29 . . . electron injection blocking layer
32 . . . hole injection blocking layer
30 . . . common electrode
31 . . . support substrate

EMBODIMENT

An embodiment of this invention will be described hereinafter with reference to the drawings.

Figure 2:
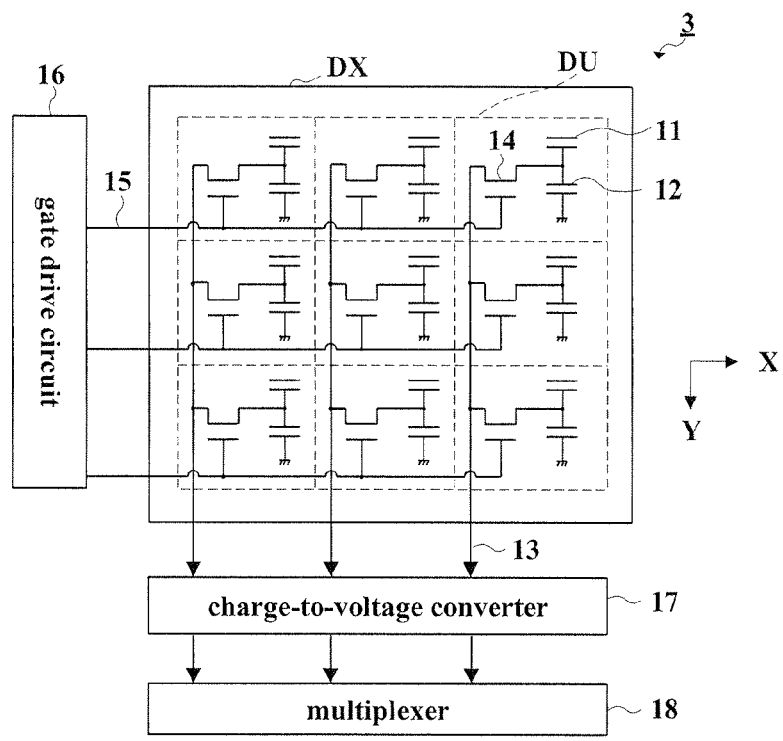
FIG. 2 is a block diagram showing a construction of an X-ray flat panel detector according to the embodiment.
Figure 3:
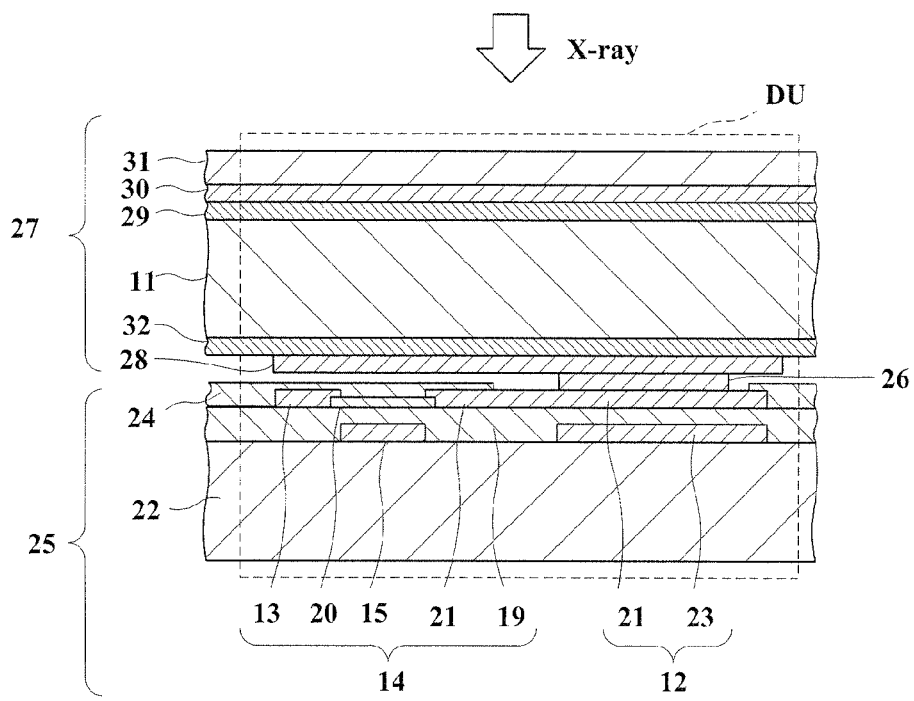
FIG. 3 is a view in vertical section showing a construction per pixel of the X-ray flat panel detector according to the embodiment.
Figure 4:
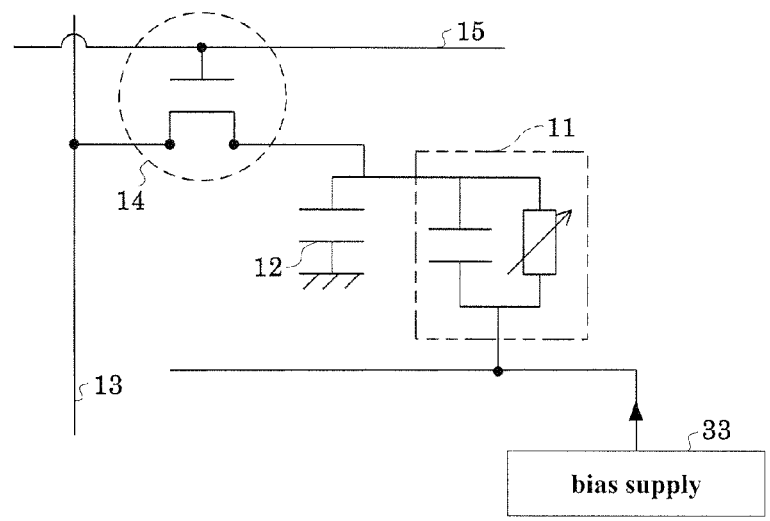
FIG. 4 is a circuit diagram showing an equivalent circuit per pixel of the X-ray flat panel detector according to the embodiment.

FIG. 1 is a block diagram showing an overall construction of an X-ray imaging apparatus according to the embodiment. FIG. 2 is a block diagram showing a construction of an X-ray flat panel detector. FIG. 3 is a side view in vertical section showing one pixel of the X-ray flat panel detector. FIG. 4 is a circuit diagram showing an equivalent circuit per pixel of the X-ray flat panel detector. This embodiment will be described taking the X-ray flat panel detector (hereinafter called FPD) as an example of the radiation detector.

<X-Ray Imaging Apparatus>

As shown in FIG. 1, the X-ray imaging apparatus includes an X-ray tube 1 for emitting X-rays to a patient M who is a subject to be imaged, a top board 2 for supporting the patient M, an FPD 3 for generating electric charge signals corresponding to an X-ray dosage transmitted through the patient M (detecting X-rays as charge signals) and further converting these charge signals into voltage signals for output, an analog-to-digital converter 4 for converting the voltage signals outputted from the FPD 3 from analog to digital, an image processor 5 for processing the digital voltage signals converted by the analog-to-digital converter 4 to construct images, a main controller 6 for performing various controls relating to X-ray imaging, an X-ray tube controller 7 for controlling the X-ray tube 1 by generating a tube voltage and tube current under control of the main controller 6, an input unit 8 for enabling input settings to be made for the X-ray imaging, a display unit 9 for displaying the X-ray images resulting from the processing by the image processor 5, and a storage unit 10 for storing the X-ray images resulting from the processing by the image processor 5. The X-ray tube 1 corresponds to the radiation emitting device in this invention.

<X-Ray Flat Panel Detector>

As shown in FIGS. 2 and 3, the circuit construction of the FPD 3 includes a conversion layer 11 for converting X-rays into carriers (electron-hole pairs), capacitors 12 for storing electric charges induced from the carriers generated in the conversion layer 11, thin-film transistors (hereinafter called the TFTs) 14 for performing switching action between the capacitors 12 and data lines 13 based on gate voltage signals, a gate drive circuit 16 for sending the gate voltage signals to the TFTs 14 through gate lines 15, a charge-to-voltage converter 17 for converting into voltage signals the charge signals read from the capacitors 12 to the data lines 13, and a multiplexer 18 for collecting the voltage signals outputted from the charge-to-voltage converter 17 into one for output. The FPD 3 corresponds to the radiation detector in this invention.

The FPD 3 includes an X-ray detecting portion DX with an opposite substrate 27 connected to an active matrix substrate 25 having numerous TFTs 14 arranged in a grid pattern. Although the TFTs 14 are in an arrangement of 3×3 vertically and horizontally in FIG. 2 in order to simplify description, they are in practice arranged in a two-dimensional matrix form of 1024×1024, for example.

The X-ray detecting portion DX is constructed by connecting the active matrix substrate 25 and opposite substrate 27 by a bump electrode 26 provided for each detecting element DU. The detecting element DU includes the conversion layer 11, and a data line 13, a gate line 15, an insulating film 19, a gate channel 20 and a capacity electrode 21 constituting the TFT 14. The data line 13 is also a drain electrode of the TFT 14, and the capacity electrode 21 is also a source electrode of the TFT 14. For the structure of the active matrix substrate 25, the gate line 15 and ground line (GND line) 23 are laminated on an X-ray incidence side of an insulating substrate 22, and further the gate channel 20 is laminated opposite the gate line 15 across the insulating film 19. The data line 13 and capacity electrode 21 are laminated on, as partly overlapping, opposite ends of the gate channel 20, respectively. An insulating film 24 for protection is laminated on the insulating film 19, gate channel 20, data line 13 and capacity electrode 21 except for a connection with the pixel electrode 28.

The capacity electrode 21 is connected through the bump electrode 26 to the pixel electrode 28 provided for the opposite substrate 27. An electron injection blocking layer 29 is laminated on an upper surface of the conversion layer 11 which converts X-rays into carriers, a common electrode 30 is laminated further thereon, and a support substrate 31 is laminated still further thereon. A hole injection blocking layer 32 is laminated on a lower surface of the conversion layer 11, and the pixel electrodes 28 are laminated further thereunder. Here, the X-ray incidence side is assumed to face upward and the reverse side downward. Thus, the opposite substrate 27 includes the support substrate 31, common electrode 30, electron injection blocking layer 29, conversion layer 11, hole injection blocking layer 32 and pixel electrodes 28. One pixel of the FPD 3 is formed of one X-ray detecting element DU. The bump electrodes 26 correspond to the connection electrodes in this invention.

The electron injection blocking layer 29 and hole injection blocking layer 32 are formed as a pair for the conversion layer 11. As to which of the electron injection blocking layer 29 and hole injection blocking layer 32 is formed between the common electrode 30 and conversion layer 11, it is preferable to make a selection according to the polarity (positive or negative) of the bias voltage applied to the common electrode 30. When the bias voltage is a negative bias, it is preferable to form the electron injection blocking layer 29 between the common electrode 30 and conversion layer 11. In this case, it is preferable to form the hole injection blocking layer 32 between the conversion layer 11 and pixel electrodes 28. When the bias voltage is a positive bias, it is preferable to form the hole injection blocking layer 32 between the common electrode 30 and conversion layer 11, and it is preferable to form the electron injection blocking layer 29 between the conversion layer 11 and pixel electrodes 28. The hole injection blocking layer 32 has a property to block passage of positive charges, and may be an n-type semiconductor layer such as CdS or ZnS film, for example. The electron injection blocking layer 29 has a property to block passage of electrons, and may be a p-type semiconductor layer such as $Sb_2Te_3$, $Sb_2S_3$ or ZnTe film, for example. The electron injection blocking layer 29 and hole injection blocking layer 32 correspond to the carrier injection blocking layer in this invention.

As shown in FIG. 4, in a state of the bias voltage being applied from a bias supply 33 to the common electrode 30 through the support substrate 31, an electric field occurs in the conversion layer 11, the carriers converted from incident X-rays in the conversion layer 11 induce electric charges for the capacitors 12, and the charges are stored in the capacitors 12. Next, the respective X-ray detecting elements DU are selected on a row-by-row basis by applying the voltage of the gate lines 15, and the gates of the TFTs 14 in a selected row are turned on. And the charges provisionally stored in the capacitors 12 until the TFTs 14 are turned on are read as charge signals onto the data lines 13 through the TFTs 14. The charge-to-voltage converter 17 converts the charge signals read to the respective data lines 13 into voltage signals, and the multiplexer 18 outputs these signals as bundled into one voltage signal. The analog-to-digital converter 4 digitizes the outputted voltage signal and outputs it as an X-ray detection signal. In this way, the electric signals converted from X-rays in the conversion layer 11 can be taken out as X-ray detection signals.

The FPD3 having the above construction, with the conversion layer 11 and active matrix substrate 25 integrated together as shown in FIGS. 2 and 3, functions as a two-dimensional image detector. Consequently, the carriers generated in the conversion layer 11 are collected for the separate pixel elements by the active matrix substrate 25, and stored for every pixel element and read as electric signals.

As the above support substrate 31, what has a small radiation absorption coefficient is preferred, and materials such as glass, ceramic ($Al_2O_3$, AlN), graphite and silicon, for example, are employable. Conductive materials having a small radiation absorption coefficient such as graphite and silicon can dispense with the common electrode 30.

The conversion layer 11 is a polycrystal semiconductor film of CdZnTe having a Zn concentration described hereinafter, and further doped with Cl in a concentration described hereinafter. The common electrode 30 and pixel electrodes 28 are formed of an electrical conducting material such as ITO (Indium Tin Oxide), Au (gold) or Pt (platinum), for example.

<X-Ray Flat Panel Detector Manufacturing Method>

Next, a method of manufacturing the FPD 3 in Embodiment 1 will be described. For the FPD 3 to have the structure in which the active matrix substrate 25 and opposite substrate 27 are connected through the bump electrodes 26 as shown in FIG. 3, the active matrix substrate 25 and opposite substrate 27 are formed in separate steps, and thereafter the two are connected by the bump electrodes 26. So, a method of forming the active matrix substrate 25 will first be described below.

A step of forming the active matrix substrate 25 will be described with reference to FIG. 3. A glass substrate is used as the insulating substrate 22, and the gate lines 15 and ground lines 23 consisting of metal film such as Ta (tantalum), Al (aluminum) or Mo (molybren) are formed thereon. The gate lines 15 and ground lines 23 are formed by film forming screening in which the metal film is sputtered to a thickness of about 4000 Å.

Next, SiNx (silicon nitride) or SiOx (silicon oxide) is formed into films about 3500 Å thick by CVD (Chemical Vapor Deposition) method to form the insulating films 19. The insulating films 19 act as gate insulating films, and also act as insulating films for the capacitors 12 in the relation between capacity electrodes 21 and ground lines 23. For the insulating films 19, not only SiNx or SiOx but anode oxide films having anodized the gate lines 15 and capacity electrodes 21 may also be used in combination.

Next, after forming a-Si (amorphous silicon) into a film of about 1000 Å by CVD method, impurities are diffused to make an n+ layer, which is shaped as desired by screen printing to form the gate channels 20.

Next, the data lines 13 and capacity electrodes 21 consisting of metal films such as of Ta, Al or Ti (titanium) are formed. The data lines 13 and capacity electrodes 21 are formed as films about 4000 Å thick by sputtering. The gate lines 15, insulating films 19, capacity electrodes 21, data lines 13 and gate channels 20 formed in this way constitute the TFTs 14. It is also possible to use transparent electrodes such as of ITO for the capacity electrodes 21.

Further thereafter, the insulating films 24 are formed in order to insulate and protect areas other than the openings of the capacity electrodes 21. As the insulating films 24, SiNx or SiOx is formed into films about 6000 Å thick by CVD method. It is also possible to use organic films, apart from the inorganic films, such as of acrylic or polyimide, for the insulating films 24.

The active matrix substrate 25 is formed as described above. The TFTs 14 of bottom gate structure using a-Si are used as switching elements here, but this is not limitative. It is possible to use p-Si (polysilicon) and a top gate structure.

Figure 5:
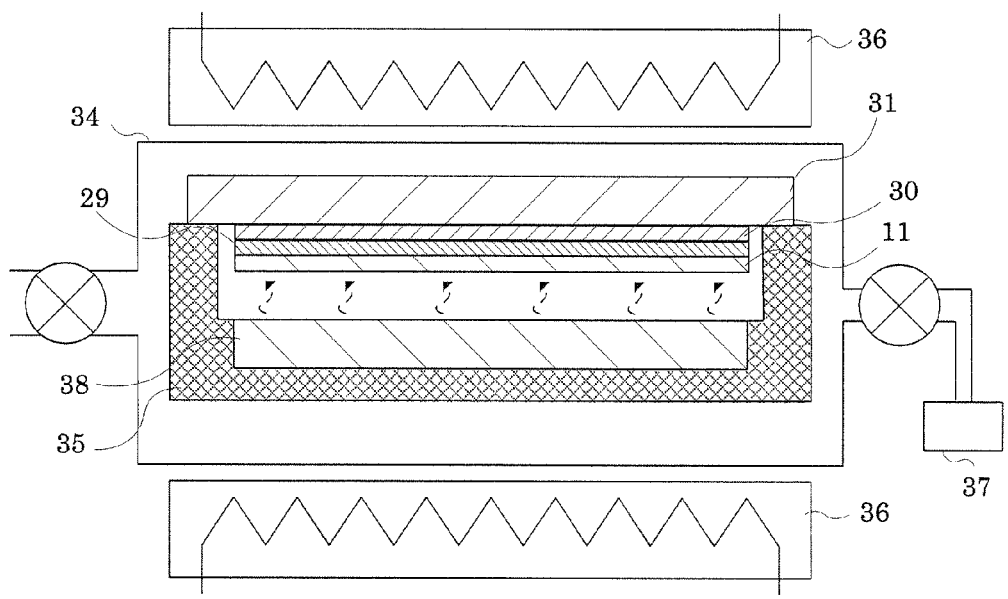
FIG. 5 is an explanatory view of forming a conversion layer according to the embodiment by proximity sublimation method.

Next, a method of forming the opposite substrate 27 opposed and connected to the active matrix substrate 25 will be described with reference to FIGS. 3 and 5. FIG. 5 is an explanatory view of a proximity sublimation method for forming a polycrystal compound semiconductor layer.

First, the common electrode 30 is formed on the support substrate 31. As the common electrode 30, a thin film of Au (gold) or Pt (platinum) may be mentioned. The common electrode 30 can be formed by vacuum deposition or sputtering method, for example. Next, the electron injection blocking layer 29 is laminated and formed on the common electrode 30. The electron injection blocking layer 29 can be laminated and formed of ZnTe film by proximity sublimation method, sputtering method or electrocrystallization method, for example.

Next, the conversion layer 11 is formed as a film by proximity sublimation method on the support substrate 31 on which the common electrode 30 and electron injection blocking layer 29 have been laminated. As shown in FIG. 5, in a vacuum chamber 34, to be opposed to a lower susceptor 35 filled with the material for the conversion layer 11, the support substrate 31 is placed on peripheries of the lower susceptor 35 with the electron injection blocking layer 29 facing the lower susceptor 35.

Lamp heaters 36 are arranged above and below the vacuum chamber 34. After operating a vacuum pump 37 to decompress the atmosphere inside the vacuum chamber to 10 Torr or less, heat is applied by the upper and lower lamp heaters 36 to heat a source 38 in the lower susceptor 35 and the support substrate 31 to about 700° C. Consequently, the source 38 in the lower susceptor 35 sublimates, whereby the conversion layer 11 is laminated and formed on a surface of the electron injection blocking layer 29 on the support substrate 31. In order to form the sublimated source 38 efficiently on the surface of the electron injection blocking layer 29 on the support substrate 31, the temperature of the support substrate 31 is set slightly lower than the temperature of the source 38.

The thickness of the conversion layer 11 is formed to be about 600 μm. As the film forming method for the conversion layer 11, an MOCVD (Metal Organic Chemical Vapor Deposition) method or a paste printing/calcinating method can be used besides the proximity sublimation method.

Used as the source 38 filled into the lower susceptor 35 are CdTe, ZnTe and $CdCl_2$ (cadmium chloride) mixed in a certain ratio, and heat-sintered by a lamp heater under decompression beforehand. In this case, the composition of the sintered compact of the source 38 can be adjusted by adjusting the mixing ratio of CdTe, ZnTe and $CdCl_2$. Zn and Cl concentrations of the Cl-doped CdZnTe polycrystal compound semiconductor layer of the conversion layer 11 formed on the surface of the electron injection blocking layer 29 are determined by the composition ratio of this sintered compact of the source 38 and film forming conditions (temperature of the source 38, temperature of the support substrate 31 and degree of vacuum in the vacuum chamber 34).

Next, the surface of the conversion layer 11 is polished and planarized. The polishing method uses a CMP (Chemical and Mechanical Polishing) apparatus which uses a polishing agent. Consequently, the thickness of the conversion layer 11 is adjusted to about 400 μm. With this level of thickness, X-rays based on a tube voltage of the X-ray tube 1 at about 50-140 kV can be fully converted into carriers.

Next, the hole injection blocking layer 32 is formed on the planarized surface of the conversion layer 11. Further, the pixel electrodes 28 are formed in predetermined positions on the surface of the hole injection blocking layer 32. The pixel electrodes 28 and hole injection blocking layer 32 can be formed by vapor deposition or sputtering method. The hole injection blocking layer 32 and pixel electrodes 28 may be omitted so far as detector characteristics permit.

The above completes formation of the opposite substrate 27. Since the opposite substrate 27 is formed in a separate step to the active matrix substrate 25 as described above, even if the forming temperature of the conversion layer 11 is higher than the heat-resistant temperature of the TFTs 14 of the active matrix substrate 25, the conversion layer 11 can be formed without damaging the TFTs 14.

Next, the active matrix substrate 25 and opposite substrate 27 formed in the separate steps are bump-bonded through the bump electrodes 26 in positions between capacity electrodes 21 and pixel electrodes 28 corresponding to each other. The bump electrodes 26 are formed by screen-printing a conductive paste. The connection may be made by using anisotropic conductive films (ACF) instead of the bump electrodes 26.

The conductive paste is formed, for example, of a base material having rubber as a main component, which is blended with a conductive material having carbon as a main component, and a binder resin hardening with an organic substance volatilizing gradually by being left standing at normal temperature. The conductive material included in this conductive paste may be selected from any materials as appropriate, as long as they are conductive. Although rubber is given as an example of the main component of the base material, other polymeric materials may be used. The binder resin is not necessarily limited to a resin, but may be a mixture of materials having adhesiveness and hardenability.

The conductive paste, preferably, includes a material such as the binder resin, for example, which hardens with an organic substance volatilizing gradually by being left standing at normal temperature. However, a material hardenable by application of temperature changes may be included. By screen-printing this conductive paste, the bump electrodes 26 are formed on all the capacity electrodes 21 formed on the active matrix substrate 25. The above completes manufacture of the X-ray detecting portion DX. A sequence of manufacturing the FPD 3 is ended by subsequently connecting the gate drive circuit 16, charge-to-voltage converter 17 and multiplexer 18 to the X-ray detecting portion DX.

As a method of Cl doping, besides doping at the time of formation of the conversion layer 11 by proximity sublimation method, Cl doping may be carried out again by heat treatment in a Cl gas atmosphere after the conversion layer 11 is laminated and formed. In this case also, it is preferred that the Cl concentration in the Cl-doped CdZnTe polycrystal compound semiconductor layer at the time of completion of the conversion layer 11 is from 1 ppm wt to 3 ppm wt inclusive.

As a method of Zn doping also, as in the Cl doping, besides doping at the time of lamination and formation of the conversion layer 11 by proximity sublimation method, CdZnTe doped with Zn beforehand may be employed in the source for the proximity sublimation method. It is preferred that the Zn concentration in the Cl-doped CdZnTe polycrystal compound semiconductor layer at the time of completion of the conversion layer 11 is from 1 mol % to 5 mol % inclusive.

In the FPD 3 manufactured as described above, the conversion layer 11 is the Cl-doped CdZnTe polycrystal compound semiconductor layer, the Zn concentration in the layer is from 1 mol % to 5 mol % inclusive, and the Cl concentration is from 1 ppm wt to 3 ppm wt inclusive. Thus, the leakage current value is reduced and the response sensitivity to radiation is also good. The effects of such concentrations of Zn and Cl will be described hereunder.

The effects of the FPD 3 with respect to the Zn dope concentration and Cl dope concentration in the Cl-doped CdZnTe of the conversion layer 11 will be described with reference to FIGS. 6-13.

Figure 6:
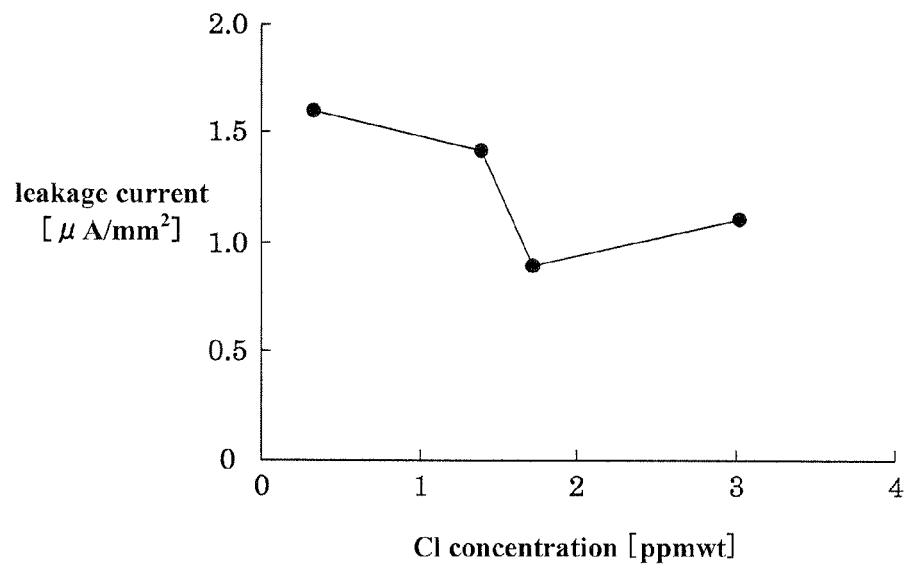
FIG. 6 is a characteristic view of leakage current of the conversion layer in relation to Cl concentration.
Figure 7:
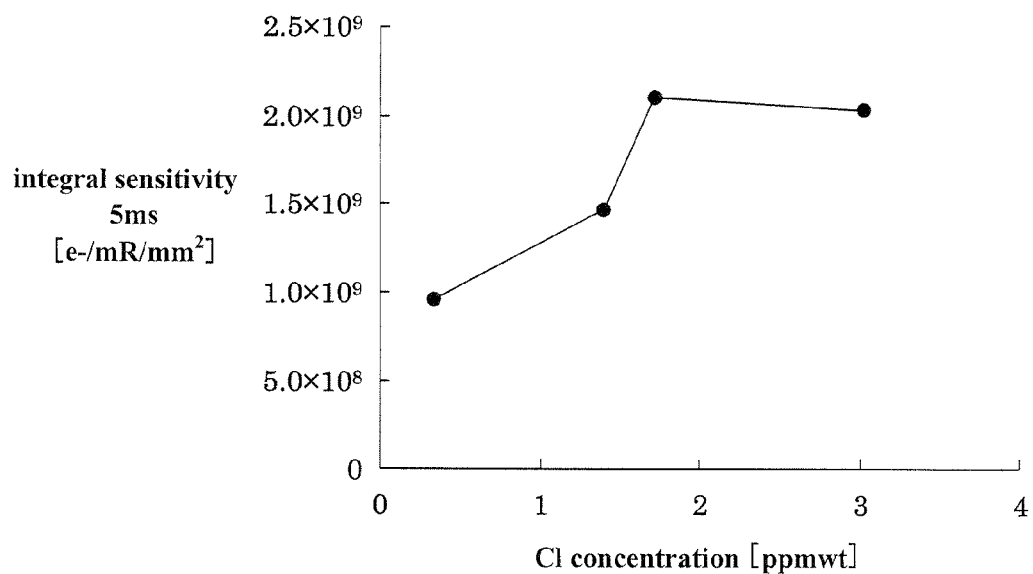
FIG. 7 is a characteristic view of X-ray sensitivity of the conversion layer in relation to Cl concentration.

Inventor herein checked to find out what differences in performance occurred from differences in the doped Cl concentration in the CdZnTe polycrystal compound semiconductor layer, and obtained results as shown in FIGS. 6 and 7. According to FIG. 6, it has been found that, when the CdZnTe polycrystal compound semiconductor layer having a constant component ratio is doped with Cl in varied concentrations, a local minimal value results from a Cl concentration of about 2 ppm wt in the polycrystal compound semiconductor layer. According to FIG. 7, it has been found that, although integral sensitivity increases with the more Cl used to dope the CdZnTe polycrystal compound semiconductor layer having a constant component ratio, the integral sensitivity, after reaching a peak also around the Cl concentration of about 2 ppm wt, lowers even if the Cl concentration is increased. Thus, when the Cl concentration is too low, the resistivity of the polycrystal compound semiconductor layer will fall, thereby increasing leakage current. Further, since the mobility of carriers worsens, sensitivity response worsens. It also becomes easy for twin defects to generate within crystal grains.

The Cl concentration dependence of the polycrystal compound semiconductor layer with regard to the above leakage current and sensitivity response can be explained by means of the following model. That is, a minute amount of doped Cl acts as a donor in the polycrystal compound semiconductor layer, and optimal values of leakage current and sensitivity response can be acquired by an optimal concentration (up to 2 ppm wt) that compensates for defect levels existing in the polycrystal compound semiconductor layer (within crystal grains and at crystal brain boundaries). However, it is thought that a further, excessive dope will conversely induce new defects to deteriorate characteristics.

Figure 8:
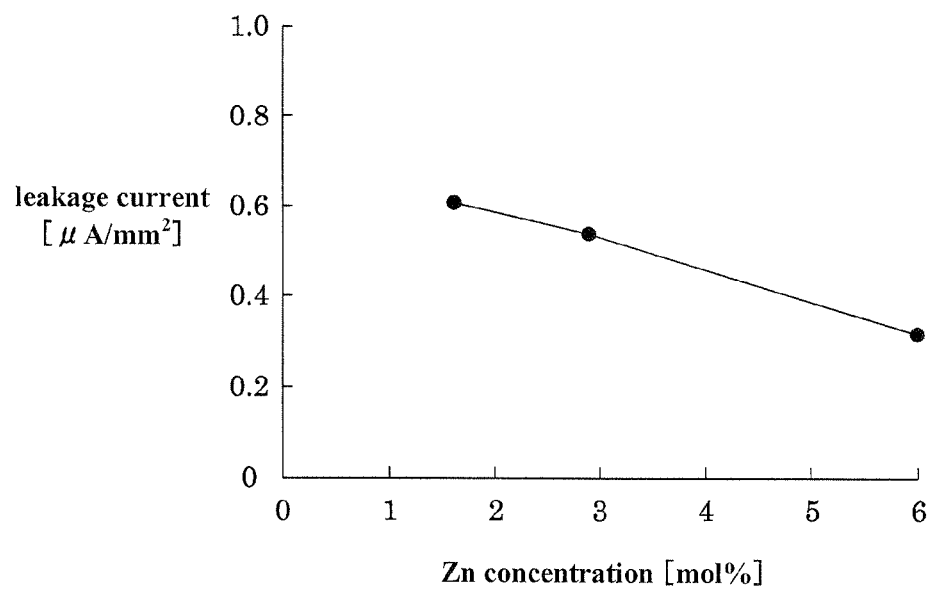
FIG. 8 is a characteristic view of leakage current of the conversion layer in relation to Zn concentration.
Figure 9:
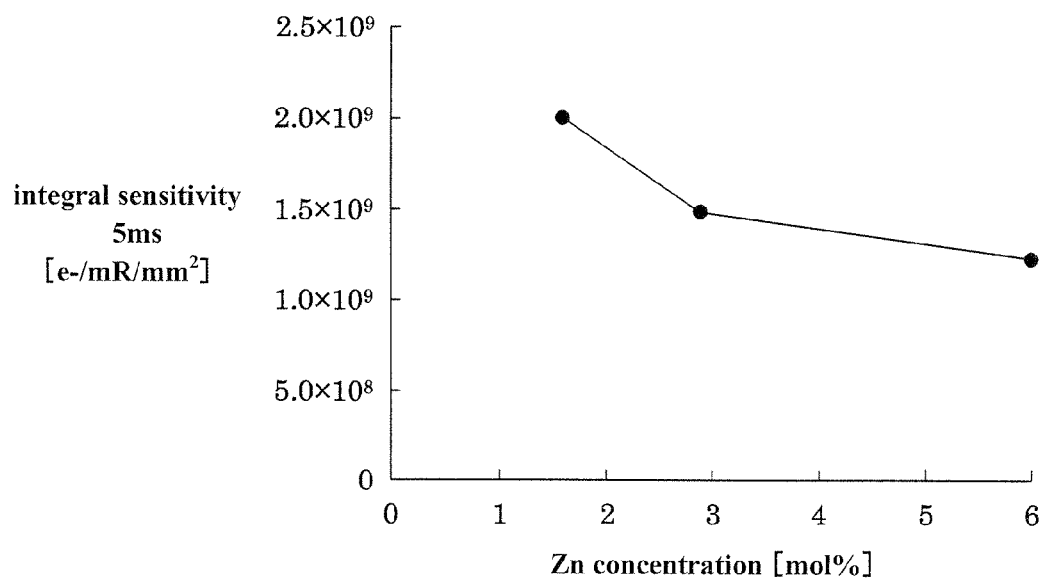
FIG. 9 is a characteristic view of X-ray sensitivity of the conversion layer in relation to Zn concentration.

Next, checking was made to find out what differences in performance occurred from differences in the Zn concentration in the CdZnTe polycrystal compound semiconductor layer when the Cl concentration was constant, and obtained results as shown in FIGS. 8 and 9. According to FIG. 8, the lower the Zn concentration is, the more the leakage current increases. It is thought that this is because the band gap will contract when the Zn concentration decreases, and that it is the same as the case of the CdZnTe single crystal that the leakage current increases for this reason. Further, when ZnTe is used as the electron injection blocking layer 29, with the Cl-doped CdTe polycrystal compound semiconductor layer not doped with Zn, the electron injection blocking layer 29 formed on its surface does not function as a barrier layer for preventing an injection of electrons, which extremely deteriorates the leakage current characteristic and the response to X-rays.

Conversely, in the Cl-doped CdZnTe polycrystal compound semiconductor layer, the more the Zn concentration increases, the more the leakage current decreases. However, according to FIG. 9, it has been found that the more the concentration of Zn increases, the more the integral sensitivity decreases. That is, since ZnTe has a larger band gap than CdTe, when the concentration of Zn becomes high, the leakage current which flows in the polycrystal compound semiconductor layer will decrease exponentially. However, compared with Cd, Zn provides a low mobility of holes and also increases crystal defects. An increase in the concentration of Zn will lower the integral sensitivity of the CdZnTe polycrystal compound semiconductor layer.

Figure 10:
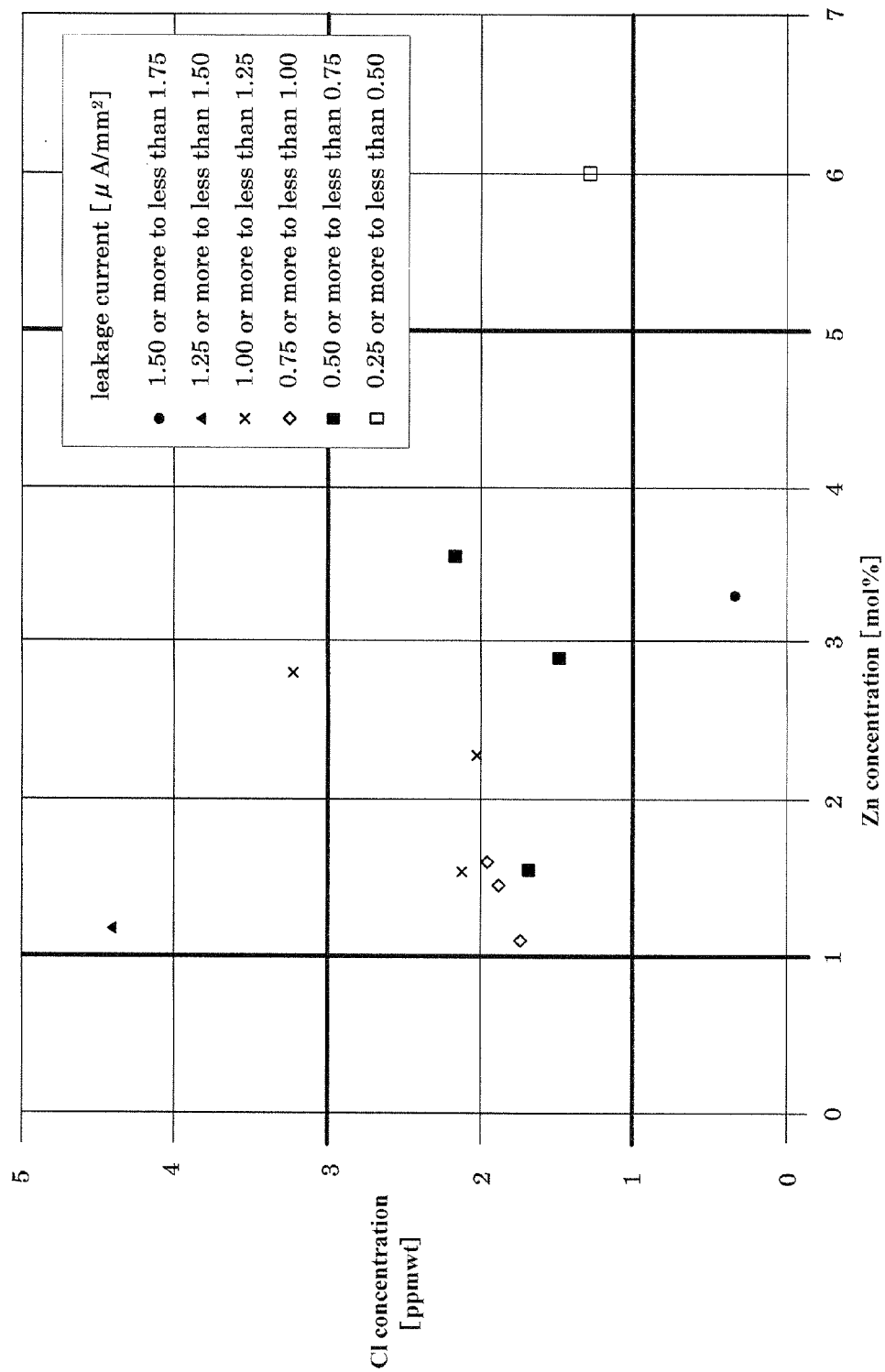
FIG. 10 is a characteristic view of leakage current of the conversion layer in relation to Zn concentration and Cl concentration.

As described above, unlike a single crystal body, there are actions of Cl concentration and Zn concentration peculiar to the polycrystal compound semiconductor layer. Each characteristic tendency when each of the Cl concentration and Zn concentration is adjusted is as described above, but when the Cl concentration and Zn concentration are changed at the same time, proper concentrations of both will change. So, a relationship with leakage current when the Zn concentration and Cl concentration in the CdZnTe polycrystal compound semiconductor layer are adjusted variously is shown in FIG. 10. A relationship with the integral sensitivity to radiation is shown in FIG. 11.

FIG. 10 shows the leakage current of the Cl-doped CdZnTe polycrystal compound semiconductor layer when each of the Zn concentration and Cl concentration is adjusted. Here, when the Zn concentration in the film is from 1 mol % to 5 mol % inclusive and the Cl concentration in the film is from 1 ppm wt to 3 ppm wt inclusive, the leakage current of the conversion layer 11 is less than 1.25 $\mu A/mm^2$. When the film Cl concentration exceeds 3 ppm wt, the leakage current will become high as shown in FIG. 6 also, and a leakage current of 1.25 $\mu A/mm^2$ or more flows as indicated by mark in FIG. 10. Even if the Cl concentration is less than 1 ppm wt, the leakage current value becomes high as shown in FIG. 6 also, and a leakage current of 1.50 $\mu A/mm^2$ or more flows as indicated by mark in FIG. 10. The more the concentration of Zn in the film increases, the more the leakage current is reduced as shown in FIG. 8 also.

Figure 11:
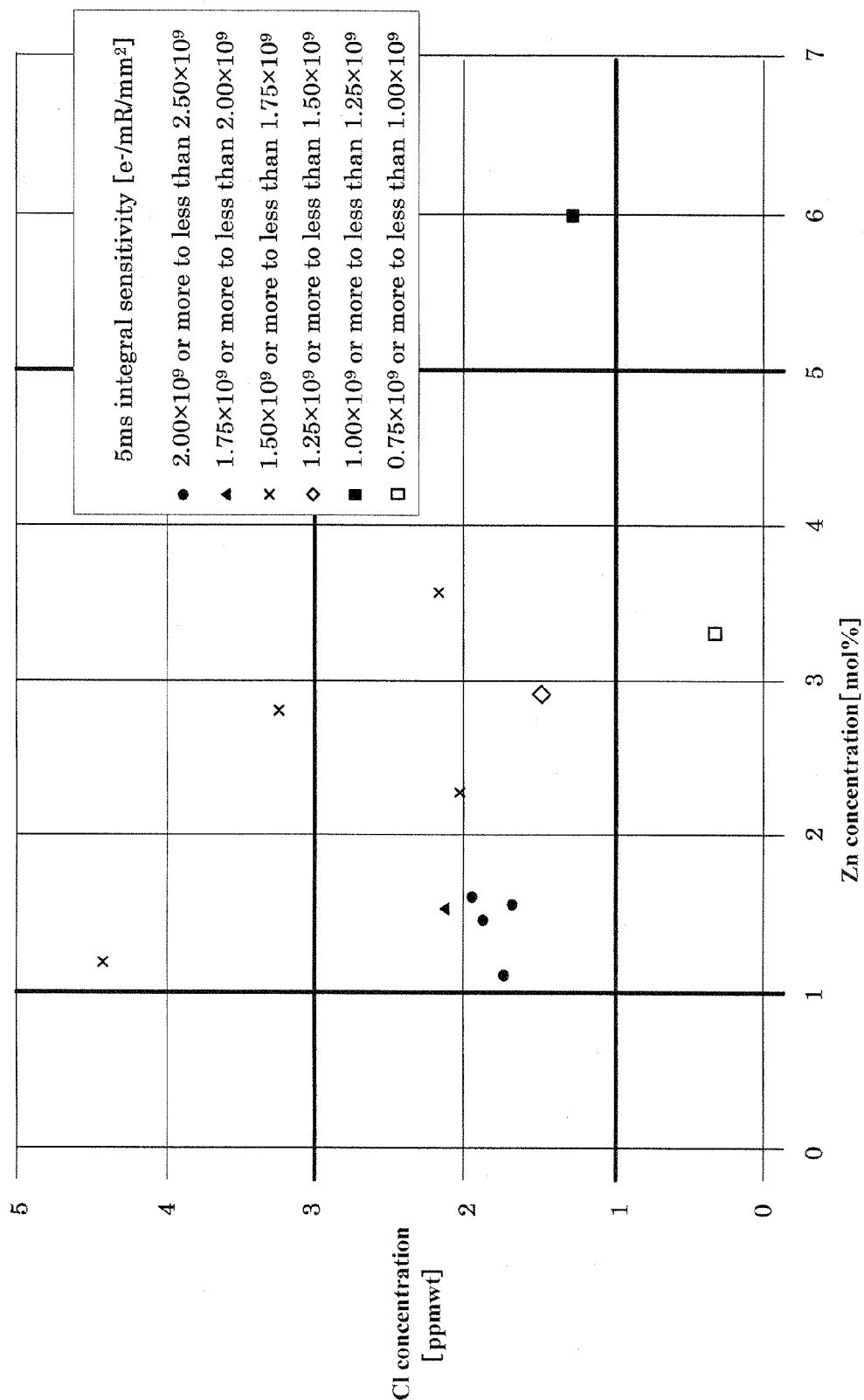
FIG. 11 is a characteristic view of X-ray sensitivity of the conversion layer in relation to Zn concentration and Cl concentration.

Next, FIG. 11 shows integral sensitivity when X-rays with a 5 ms range are emitted to the Cl-doped CdZnTe polycrystal compound semiconductor layer with each of the Zn concentration and Cl concentration adjusted. Integral sensitivity is at its best when the Cl concentration is adjacent 2 ppm wt, and with the concentration higher or lower than that, the integral sensitivity tends to worsen gradually. It is seen that the more the Zn concentration increases, the more the integral sensitivity tends to lower. The 5 ms integral sensitivity of the conversion layer 11 is $1.25 \times 10^9$ [$e^-/mR/mm^2$] or more when the Zn concentration in the polycrystal compound semiconductor layer is from 1 mol % to 5 mol % inclusive, and the Cl concentration in the polycrystal compound semiconductor layer is from 1 ppm wt to 3 ppm wt inclusive.

Particularly when the Zn concentration is from 1 mol % to 2 mol % inclusive and the Cl concentration is from 1 ppm wt to 2 ppm wt inclusive, the 5 ms integral sensitivity is $2.00 \times 10^9$ [e$^-$/mR/mm$^2$] or more, and the leakage current does not exceed 1.00 [µA/mm$^2$], either. Thus, the FPD 3 can be manufactured as having excellent response to X-rays, and with leakage current reduced to provide high S/N.

Also in the range of the Zn concentration in the polycrystal compound semiconductor layer being from 1 mol % to 5 mol % inclusive and the Cl concentration being from 1 ppm wt to 3 ppm wt inclusive, if the Zn concentration is low, the conversion layer 11 with much value placed on X-ray sensitivity can be formed and high quantum efficiency can be acquired. If the Zn concentration is high within the above range, the conversion layer 11 with much value placed on reduction of leakage current can be formed and high spatial resolution and dynamic range can be obtained.

Figure 12:
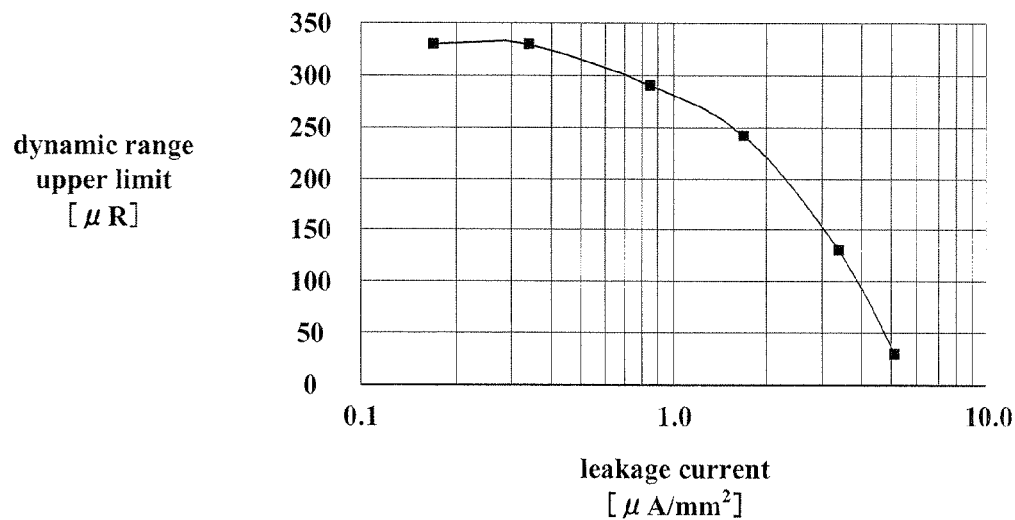
FIG. 12 is a characteristic view of leakage current in relation to dynamic range upper limit.

By setting the Cl concentration and Zn concentration in the polycrystal compound semiconductor layer within the above ranges, the leakage current value of the conversion layer 11 can be reduced to less than 1.25 µA/mm$^2$. An increase in the leakage current flowing in the conversion layer 11 will reduce an upper limit dosage of the dynamic range as shown in FIG. 12. The dynamic range decreases as the leakage current increases, and the upper limit of the dynamic range lowers sharply as the leakage current value exceeds about 1.25 µA/mm$^2$. Consequently, the upper limit of the dynamic range can be maintained at high value by reducing the leakage current value of the conversion layer 11 to less than 1.25 µA/mm$^2$.

Figure 13:
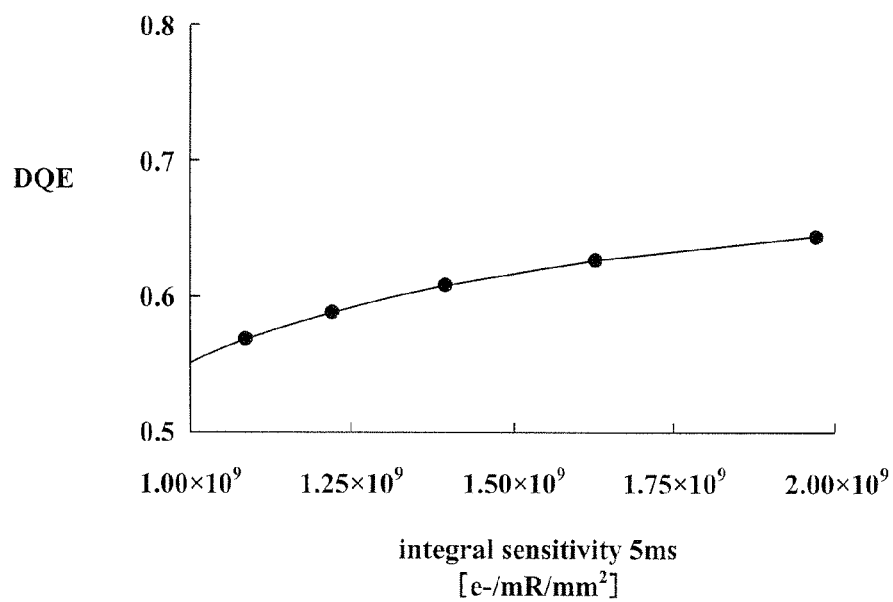
FIG. 13 is a characteristic view of integral sensitivity in relation to DQE.

With lowering of the 5 ms integral sensitivity of the conversion layer 11, detective quantum efficiency (hereinafter called DQE) which is an overall index of the image quality of the FPD 3 will lower. In the case of a radiation detector for circulatory organ fluoroscopy, DQE of at least 0.6 (at time of 0.5 µR) is desirable. This value is substantially realizable if the 5 ms integral sensitivity of the conversion layer 11 is $1.25 \times 10^9$ [e$^-$/mR/mm$^2$] or more as shown in FIG. 13.

The FPD 3 constructed as described above can effectively protect the defect level of crystal grain boundaries by setting the Cl concentration in the Cl-doped CdZeTe polycrystal compound semiconductor layer to an optimal concentration. The sensitivity to radiation can be maintained, while increasing the resistivity of the semiconductor and reducing leakage current by setting the Zn concentration in the Cl-doped CdZeTe polycrystal semiconductor film to an optimal concentration. These features enable acquisition of a radiation detector excellent in sensitivity and response to radiation, noise and S/N. Since the electron injection blocking layer or the hole injection blocking layer is formed in one surface or both surfaces of the conversion layer 11, the radiation detector obtained has a good mobility of converted charge signals. This embodiment enables also a radiation detector of large area of 10 cm square or more, especially 20 cm square or more, which has been considered difficult to produce from single crystals.

A radiographic apparatus excellent in sensitivity and response to radiation, noise and S/N can be obtained by employing the above radiation detector as radiation detector of the radiographic apparatus.

When the FPD 3 is manufactured as described above, the Cl-doped CdZnTe polycrystal compound semiconductor layer is formed to have the Zn concentration from 1 mol % to 5 mol % inclusive, and the Cl dope concentration from 1 ppm wt to 3 ppm wt inclusive. Since the proximity sublimation method is used for this formation, the growth speed of polycrystal is fast and the polycrystal compound semiconductor layer can be formed efficiently. The defect level of crystal grain boundaries can be effectively protected by Cl in a proper concentration. Further, by Zn doping in a proper concentration, the sensitivity to radiation can be maintained while increasing the resistivity of the semiconductor and reducing leakage current. These enable acquisition of a radiation detector excellent in sensitivity and response to radiation, noise and S/N.

This invention is not limited to the foregoing embodiment, but may be modified as follows:

(1) In the foregoing embodiment, the electron injection blocking layer 29 and hole injection blocking layer 32 are formed as a pair. One of them can be omitted according to a required detection characteristic. The materials for the electron injection blocking layer 29 and hole injection blocking layer 32 are not limited to the examples described hereinbefore. The pixel electrodes 28 on the surface of the hole injection blocking layer 32 can be omitted depending on a required detection characteristic.

(2) The foregoing embodiment has been described taking the proximity sublimation method as an example of physical vapor deposition. This is not limitative as long as the semiconductor is formed by vapor deposition, as exemplified by the sputtering method, CVD method, sublimation method and chemical deposition method.

(3) In the foregoing embodiment, the conversion layer 11 is constructed as radiation conversion layer, but may be constructed as optical conversion layer, such as of visible light, ultraviolet light or gamma rays, instead of being limited to radiation. The radiation detector is not limited to medical use or industrial use, but is applicable also to a radiation telescope for measuring a dose of cosmic radiation, for example.

The invention claimed is:

1. A radiation detector having a conversion layer for converting radiation into charge signals,
    wherein the conversion layer comprises a Cl-doped CdZnTe polycrystal compound semiconductor layer having a Zn concentration from 1 mol % to 5 mol % inclusive and a Cl concentration from 1 ppmwt to 3 ppmwt inclusive.

2. The radiation detector according to claim 1, wherein the conversion layer comprises a Cl-doped CdZnTe polycrystal compound semiconductor layer having a Zn concentration from 1 mol % to 2 mol % inclusive and a Cl concentration from 1 ppmwt to 2 ppmwt inclusive.

3. The radiation detector according to claim 2, comprising a carrier injection blocking layer formed on one surface or both surfaces of the conversion layer for preventing injection of electrons or holes into the conversion layer.

4. The radiation detector according to claim 3, wherein the carrier injection blocking layer comprises an n-type or p-type semiconductor layer.

5. The radiation detector according to claim 1, comprising a carrier injection blocking layer formed on one surface or both surfaces of the conversion layer for preventing injection of electrons or holes into the conversion layer.

6. The radiation detector according to claim 5, wherein the carrier injection blocking layer comprises an n-type or p-type semiconductor layer.

7. The radiation detector according to claim 1, comprising an active matrix substrate for reading the charge signals for respective detecting elements in a two-dimensional matrix arrangement formed by dividing the conversion layer.

8. The radiation detector according to claim 7, wherein an opposite substrate with the conversion layer laminated thereon and the active matrix substrate are connected by connection electrodes.

9. A radiographic apparatus comprising:
a radiation emitting device for emitting radiation to a subject;
a radiation detector for converting, in a conversion layer, radiation transmitted through the subject into charge signals, and outputting the charge signals as electric signals; and
an image processor for constructing a radiation transmission image of the subject based on the electric signals;
wherein the conversion layer comprises a Cl-doped CdZnTe polycrystal compound semiconductor layer having a Zn concentration from 1 mol % to 5 mol % inclusive and a Cl concentration from 1 ppmwt to 3 ppmwt inclusive.

10. A method of manufacturing of a radiation detector having a conversion layer for converting radiation into charge signals,
wherein the conversion layer comprises a Cl-doped CdZnTe polycrystal compound semiconductor layer formed by a proximity sublimation method and having a Zn concentration from 1 mol % to 5 mol % inclusive and a Cl concentration from 1 ppmwt to 3 ppmwt inclusive.

* * * * *